United States Patent [19]
Hirai

[11] Patent Number: 6,061,804
[45] Date of Patent: May 9, 2000

[54] PULSE GENERATING CIRCUIT FOR PROVIDING A LOW-NOISE MICROPROCESSOR CLOCK SIGNAL

[75] Inventor: Masahiko Hirai, Tokyo, Japan

[73] Assignee: NEC Corporation, Tokyo, Japan

[21] Appl. No.: 09/096,733

[22] Filed: Jun. 12, 1998

[30] Foreign Application Priority Data

Jun. 13, 1997 [JP] Japan .................................. 9-173073

[51] Int. Cl.[7] .................................................. G06F 1/06
[52] U.S. Cl. ............................................................ 713/501
[58] Field of Search .................................... 713/500, 501, 713/503; 327/100, 101, 164, 291; 331/175, 177 R

[56] References Cited

U.S. PATENT DOCUMENTS

| | | | |
|---|---|---|---|
| 4,688,205 | 8/1987 | Abiko | 369/59 |
| 4,837,643 | 6/1989 | Tierney, III | 360/51 |
| 4,859,968 | 8/1989 | Gershon | 331/38 |
| 5,142,247 | 8/1992 | Lada, Jr. et al. | 331/14 |
| 5,276,661 | 1/1994 | Beg | 368/155 |

FOREIGN PATENT DOCUMENTS 5-299985  11/1993  Japan .

*Primary Examiner*—Thomas M. Heckler
*Attorney, Agent, or Firm*—Scully, Scott Murphy & Presser

[57] ABSTRACT

A pulse generating circuit for producing the clock signal of a microcomputer is improved to reduce the dependence of noise elimination on power supply voltage. Clock pulses from an oscillator are subjected to waveform shaping and then are frequency-divided by a frequency divider circuit. A selector circuit is provided to select the input signal to or an output signal from the frequency divider circuit. A noise eliminating circuit is provided on the output side of the selector circuit. This arrangement makes it possible to generate noise-free pulses over a wide range of operating power supply voltages.

6 Claims, 8 Drawing Sheets

PULSE GENERATING CIRCUIT FOR PROVIDING A LOW-NOISE MICROPROCESSOR CLOCK SIGNAL

FIELD OF THE INVENTION

This invention relates to a pulse generating circuit and, more particularly, to a pulse generating circuit for producing the operating clock of a microcomputer or the like.

BACKGROUND OF THE INVENTION

1. Description of the Related Art

A prior-art example of a pulse generating circuit used in producing the operating clock of a microcomputer is disclosed in the specification of Japanese Patent Application Laid-Open No. 5-299985, by way of example. The specification discloses a circuit arrangement in which noise considered to be a cause of malfunction when an oscillator circuit is connected to various circuits such as a microcomputer can be eliminated from an oscillation waveform. A digital low-pass filter for delaying a change in leading and trailing edges of an input to a frequency divider circuit is provided in front of the frequency divider circuit, which frequency-divides clock pulses that have been generated by the oscillator circuit and shaped by a waveform shaping circuit.

This conventional pulse generating circuit for producing the operating clock of a microcomputer is constructed as shown in FIG. 5.

A sine wave produced as a result of oscillation derived from an inverter gate 506 and crystal oscillating element 507 has its waveform shaped by a Schmitt trigger circuit 502. Noise in the signal whose waveform has thus been shaped is removed by a noise eliminating circuit 503, after which the signal undergoes frequency division in a frequency divider circuit 504.

A selector circuit 505 connected to the output sides of the noise eliminating circuit 503 and frequency divider circuit 504 selects the output signal from the frequency divider circuit 504 or the input signal to the frequency divider circuit 504. The signal that has been selected by the selector circuit 504 is a system clock serving as the operating clock of a microcomputer.

2. Discussion on the Prior Art

In the following, the problems encountered during the course of investigations toward the present invention will be discussed in detail.

The pulse generating circuit shown in FIG. 5 is based upon the construction set forth in the above-mentioned specification. However, the arrangement in which the frequency divider circuit outputs a plurality of frequency-divided output signals and the input signal to or an output signal from the frequency divider circuit is selected by the selector circuit and used as a system clock has been added onto the circuitry disclosed in the above-mentioned specification.

The operation for eliminating noise in the generation of the operating clock of the microcomputer in accordance with the above-mentioned example of the prior art will now be described.

The noise eliminating circuit 503 in FIG. 5 has a construction of the kind shown in FIG. 6 by way of example. The operation of the noise eliminating circuit shown in FIG. 6 will be described with reference to the signal waveform diagram of FIG. 7. A signal 703 shown in FIG. 7 is the signal from an output node 703 of a delay circuit 601 in FIG. 6, a signal 704 is the signal from an output node 704 of an AND gate 602, a signal 705 is the signal from an output node 705 of a NOR gate 603, and a signal 706 is the signal from an output node 706 of a NOR gate 604. The signal 706 is the input signal of an inverter 606.

As shown in FIGS. 6 and 7, the signal 704, which is obtained by delaying the leading edge of the input signal 701, is produced by the delay circuit 601, which has been set to a delay time T, and the AND gate 602. Further, a signal 705, which is the inverse of a signal obtained by delaying the trailing edge of the input signal 701, is produced by the delay circuit 601 and the NOR gate 603.

An output signal 702, which has been delayed by the time T with respect to the input signal 701, is obtained by a flip-flop circuit comprising NOR gates 604, 605, whose outputs and inputs are cross-connected, and the inverter 606. The delay circuit 601 comprises cascade-connected inverters 607, 608 and a capacitor 609 connected to the output of the inverter 607.

A case in which noise of a duration shorter than the delay time T of the delay circuit 601 is contained in the input signal 701 will be described with reference to FIG. 6 and the timing chart of FIG. 8. As shown in FIG. 8, a signal 801 is the input signal to the delay circuit 601, a signal 803 is the signal from the output node 703 of delay circuit 60 1, a signal 804 is the signal from the output node of AND gate 602, a signal 705 is the signal from the output node 705 of NOR gate 603, a signal 806 is the signal (the input signal to the inverter 606) from the output node 706 of NOR gate 604, and a signal 802 is the output signal of the inverter 606.

Noise (tpw1 in the input signal 801 of FIG. 8) having a high-level duration shorter than the delay time T of delay circuit 601 is eliminated by the delay circuit 601 and AND gate 602, and noise (tpw2 in the input signal 801 of FIG. 8) having a low-level duration shorter than the delay time T1 is eliminated by the delay circuit 601 and NOR gate 603. Accordingly, both types of noise are absent from the output signal 802.

The delay circuit 601 shown in FIG. 6 will be described in further detail. The capacitance 609 is parasitic capacitance such as the wiring capacitance and gate capacitance of a MOS transistor, and/or or capacitance artificially fabricated. The MOS transistor within the inverter gate 607 charges and discharges the capacitance 609. The time needed for charging and discharging decides the delay time of the delay circuit.

Accordingly, in order to decide the delay time T of the delay circuit 601, it will suffice to decide the capacitance of capacitor 609 as well as the gate width and gate length of the MOS transistor within the inverter gate 607.

However, the delay time is dependent upon voltage owing to the characteristic of the MOS transistor. The delay time shortens when the operating power supply voltage rises and lengthens when the operating power supply falls. Accordingly, the delay circuit 601 must be designed in such a manner that the waveform-shaped output signal of the oscillator can be passed even when the operating power supply voltage is at its minimum value.

With the above-described conventional circuit for generating pulses used as an operating clock, the delay time of the delay circuit used in the noise eliminating circuit lengthens when the operating power supply voltage declines, and for this reason it is necessary to adopt such a design that the original signal of the oscillator will not be eliminated when the operating power supply voltage is at its smallest value. As a result, the noise eliminating effect is diminished when the operating power supply voltage is high.

According to the specifications of a microcomputer having a wide range of operating power supply voltages, a highspeed operating clock is selected when the operating power supply voltage is high, thus enabling high-speed operation, and a low-speed operating clock is selected when the operating power supply voltage is low, thus enabling low-speed operation. Operation at maximum speed, namely operation performed when the operating power supply voltage is high, is most often selected by users.

However, as mentioned above, the noise eliminating effect is diminished when the operating power supply voltage is raised, and noise penetrates to the interior of the device as a result. This raises the possibility that the microcomputer will be caused to malfunction.

SUMMARY OF THE INVENTION

Accordingly, an object of the present invention is to provide a pulse generating circuit for reducing the dependence of noise elimination on power supply voltage, such circuit being ideal for use in a circuit for generating the clock signal pulses of a microcomputer.

It is another object of the present invention to provide a microcomputer having a pulse generating circuit freed of the dependence of noise elimination on power supply voltage.

Further objects of the present invention will become apparent in the entire disclosure.

According to the present invention, the foregoing object is attained by providing a clock signal pulse generating circuit for a microcomputer having a frequency divider circuit for frequency-dividing a clock pulse signal obtained by shaping the waveform of an output signal from an oscillator, and a selector circuit for selecting an output of the frequency divider circuit or an input to the frequency divider circuit, wherein a noise eliminating circuit is connected to the output side of the selector circuit.

In a preferred embodiment of the present invention, the pulse generating circuit comprises a frequency divider circuit for frequency-dividing a clock pulse signal obtained by shaping the waveform of an output signal from an oscillator, a selector circuit for selecting one or a plurality of frequency-divided outputs of the frequency divider circuit or an input to the frequency divider circuit, and a noise eliminating circuit, to which an output signal from the selector circuit is input, for eliminating noise from this signal and outputting a system clock signal which controls operation of a digital circuit such as a microcomputer. By way of example, the noise eliminating circuit includes a delay circuit and a logic gate for eliminating noise having a pulse width of a prescribed delay time T from an input signal.

Other features and advantages of the present invention will be apparent from the following description taken in conjunction with the accompanying drawings, in which like reference characters designate the same or similar parts throughout the figures thereof.

DESCRIPTION OF THE PREFERRED EMBODIMENTS

Preferred embodiments of the present invention will now be described in detail with reference to the drawings.

First Embodiment

Figure 1:
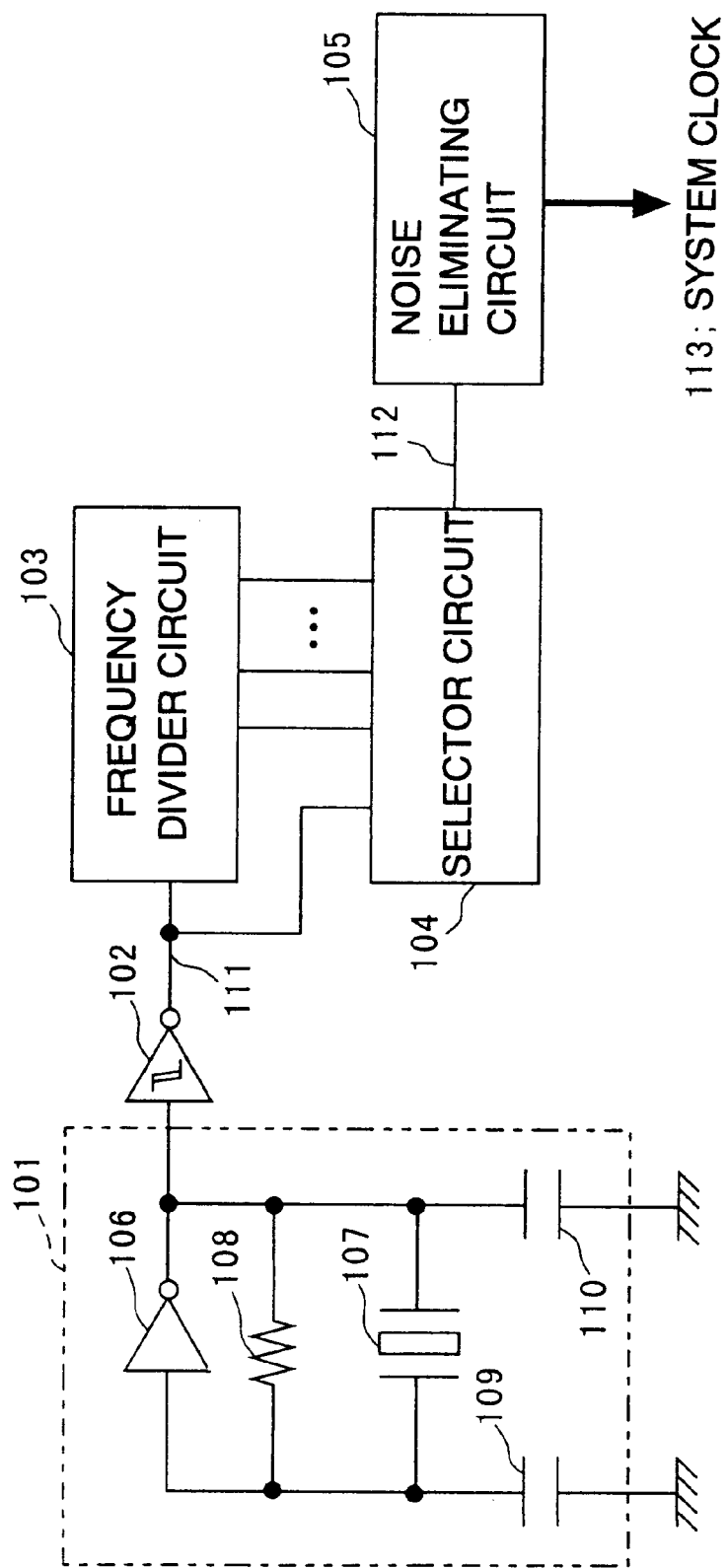
FIG. 1 is a diagram showing the construction of a pulse generating circuit according to a first embodiment of the present invention.

FIG. 1 is a diagram showing the construction of a pulse generating circuit for producing a clock signal according to a first embodiment of the present invention.

As shown in FIG. 1, the output of an oscillator 101 has its waveform shaped by a Schmitt trigger circuit 102. The signal whose waveform has thus been shaped has its frequency divided by a frequency divider circuit 103. A selector circuit 104 provided as a stage succeeding the frequency divider circuit 103 selects a frequency divided output of the frequency divider circuit 103 or the input to the frequency divider circuit. The signal that has been selected by the selector circuit 104 is passed through a noise eliminating circuit 105, whereby the noise is removed. The signal from which noise has been removed is a system clock 113 serving as the operating clock of a microcomputer.

Figure 6:
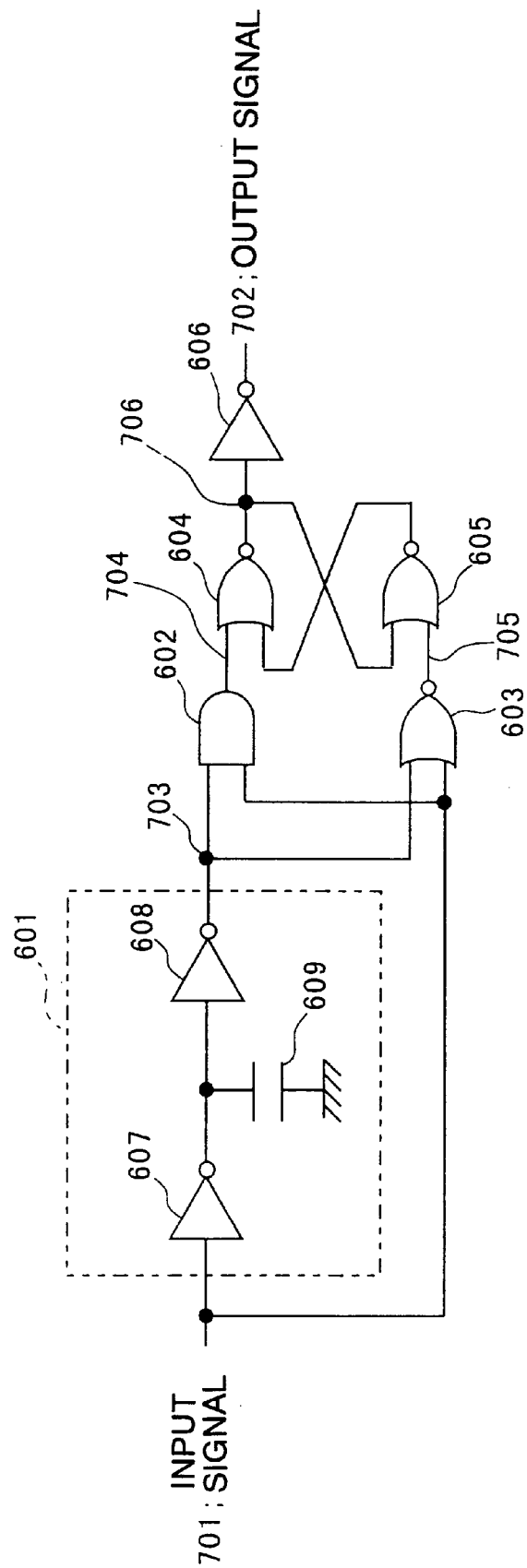
FIG. 6 is a diagram showing an example of a noise eliminating circuit used in the pulse generating circuits of the present invention and in the pulse generating circuit according to the prior art.
Figure 7:
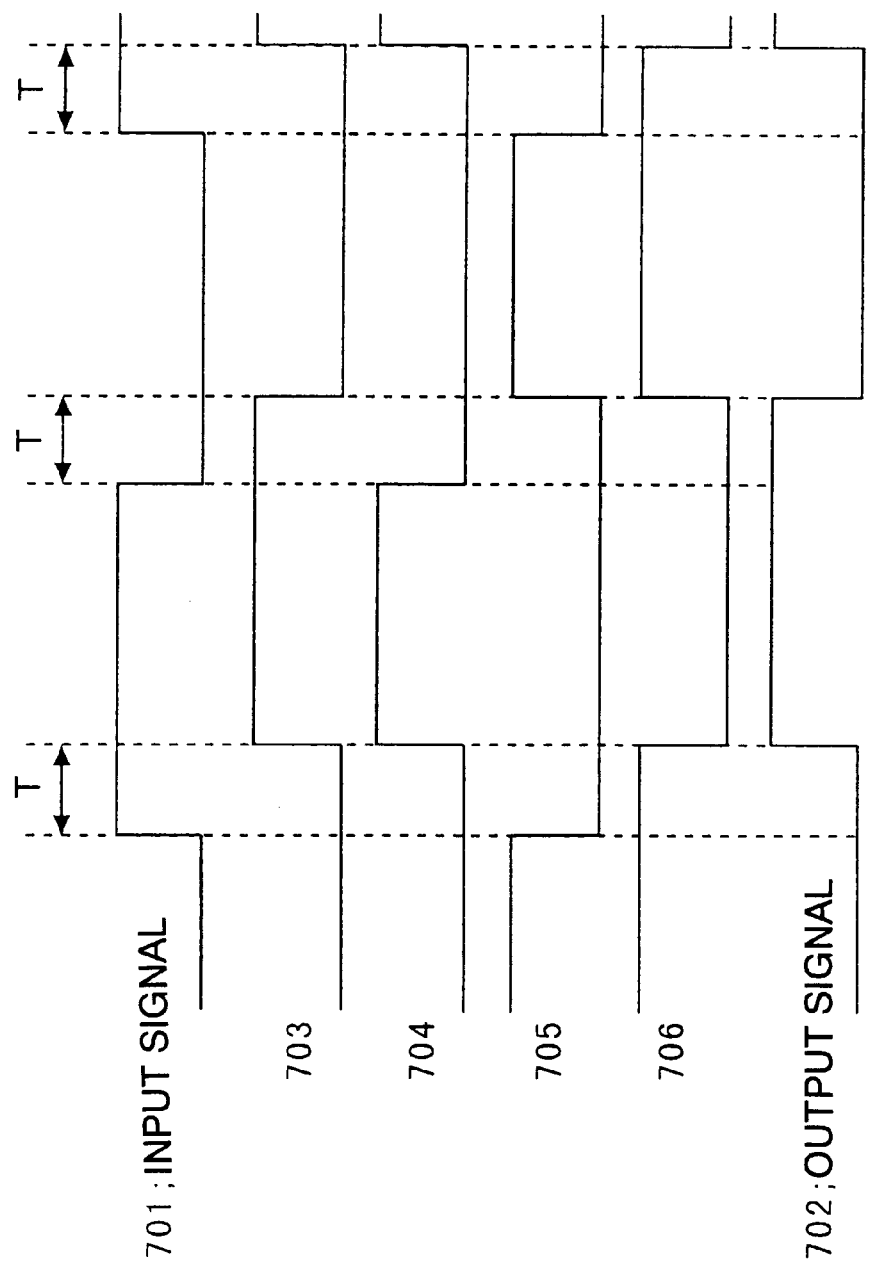
FIG. 7 is a signal waveform diagram for describing the operation of a delay circuit shown in FIG. 6.
Figure 8:
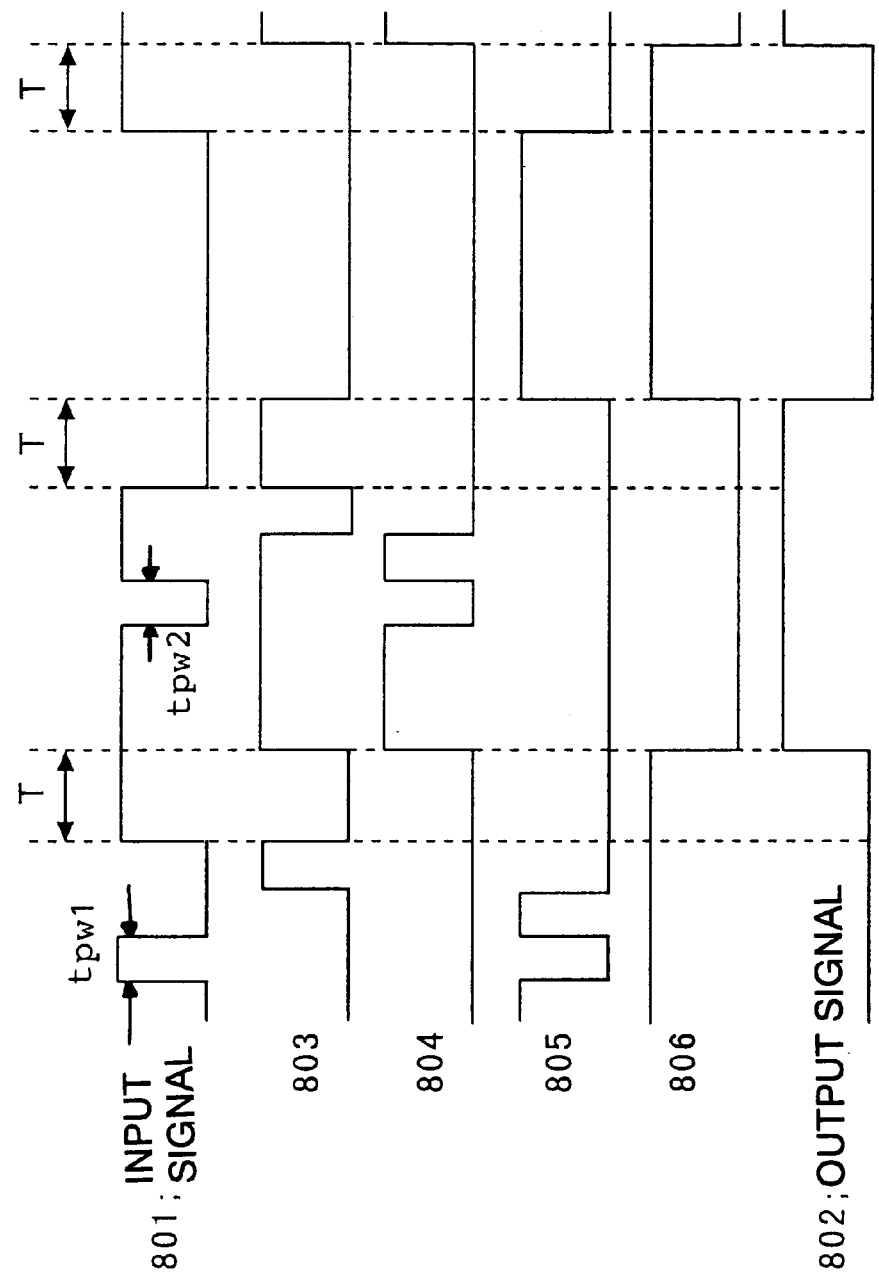
FIG. 8 is a signal waveform diagram useful in describing the operation of the delay circuit shown in FIG. 6.

The construction of the noise eliminating circuit 105 is as shown in FIG. 6, by way of example. The delay time T of the delay circuit 601 is set in such a manner that a clock signal having a frequency identical with that of the output signal of oscillator 101 can be passed when the operating power supply voltage is such that the selector circuit 104 shown in FIG. 1 is capable of selecting a high-speed operating clock.

The user is capable of selecting the high-speed clock as the system clock if the operating power supply voltage is high and the low-speed clock as the system clock if the operating power supply voltage is low.

Figure 2:
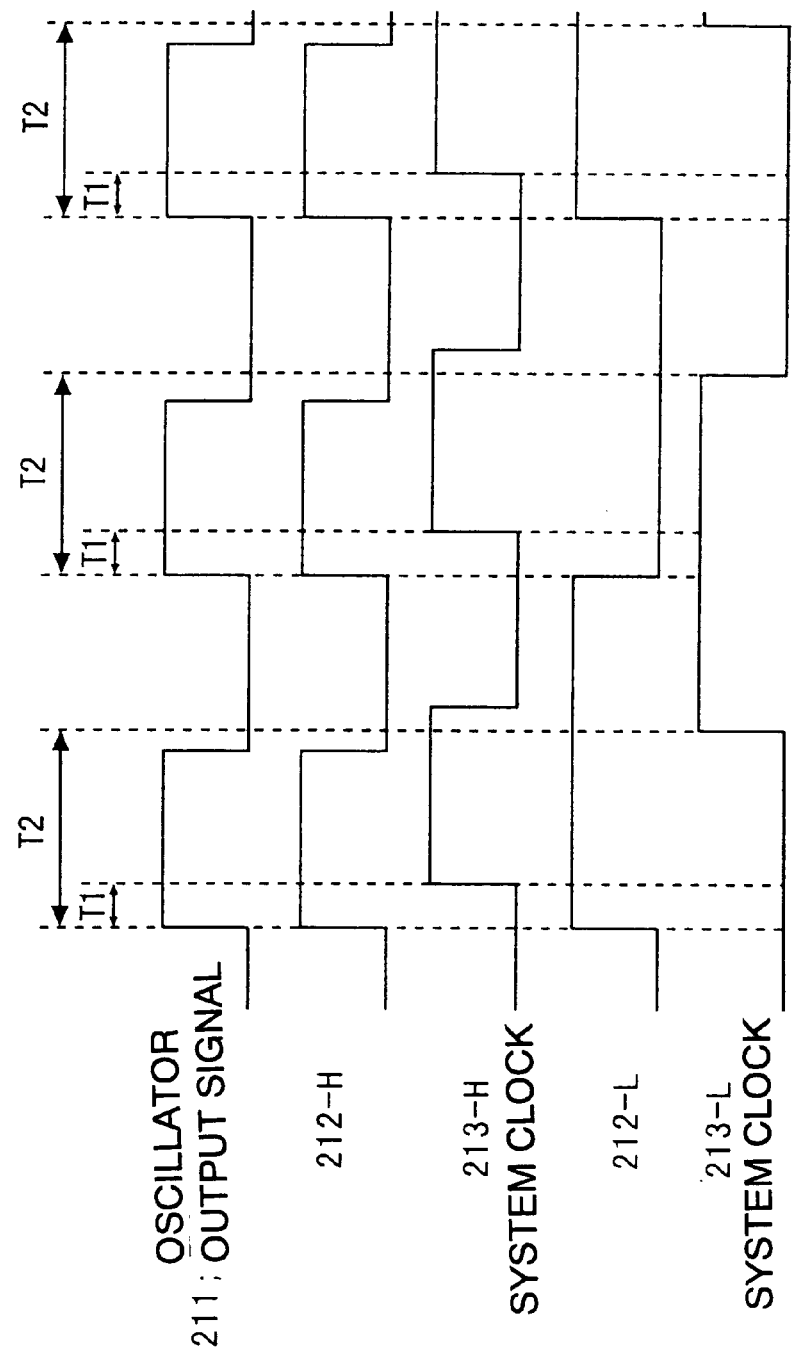
FIG. 2 is a signal waveform diagram useful in describing the operation of the pulse generating circuit according to the first embodiment.

FIG. 2 is a signal waveform diagram useful in describing the operation of the first embodiment. The operation of the first embodiment will be described with reference to FIGS. 1 and 2.

Reference numeral 211 in FIG. 2 represents the waveform-shaped oscillator output signal that has passed through the Schmitt trigger circuit 102. This is the signal at node 111 in FIG. 1. The frequency of the signal 211 has a fixed value decided by a crystal oscillating element 107 used in the oscillator 101. The signal 211 is converted to a signal of lower frequency by the frequency divider circuit 103 of FIG. 1.

The user employs the selector circuit 104 to select the input signal to the frequency divider circuit 103 or the output signal of the frequency divider circuit 103, whereby the selected signal is output to an output node 112 of the selector circuit 104. The signal at the node 112 is 212-H or 212-L in FIG. 2. The signal 212-H is the signal obtained when the input signal to the frequency divider circuit 103 has been selected, and the signal 212-L is a signal obtained when the frequency divider circuit 103 performs frequency division by two. High or low frequency is used depending upon the operating power supply voltage. That is, if the operating power supply voltage is sufficiently high, a high frequency identical with that of the output signal of oscillator 101 is used as is, as in the manner of signal 202-H in FIG. 2. If the operating power supply voltage is low, a signal having a low frequency resulting from frequency division performed by the frequency divider circuit 103 is used, as indicated at 202-L in FIG. 2.

The signal 212-H or 212-L selected by the user is passed through the noise eliminating circuit 105 of FIG. I to obtain a system clock 213-H or 213-L, respectively, shown in FIG. 2. The signal 213-H is delayed by time T1 with respect to the signal 212-H, and the signal 213-L is delayed by time T2 with respect to the signal 212-L. The times T1 and T2 are delay times of the delay circuit used in the noise eliminating circuit 105. The time T1 is the delay time when the operating power supply voltage is high, and the time T2 is the delay time when the operating power supply voltage is low.

Figure 3:
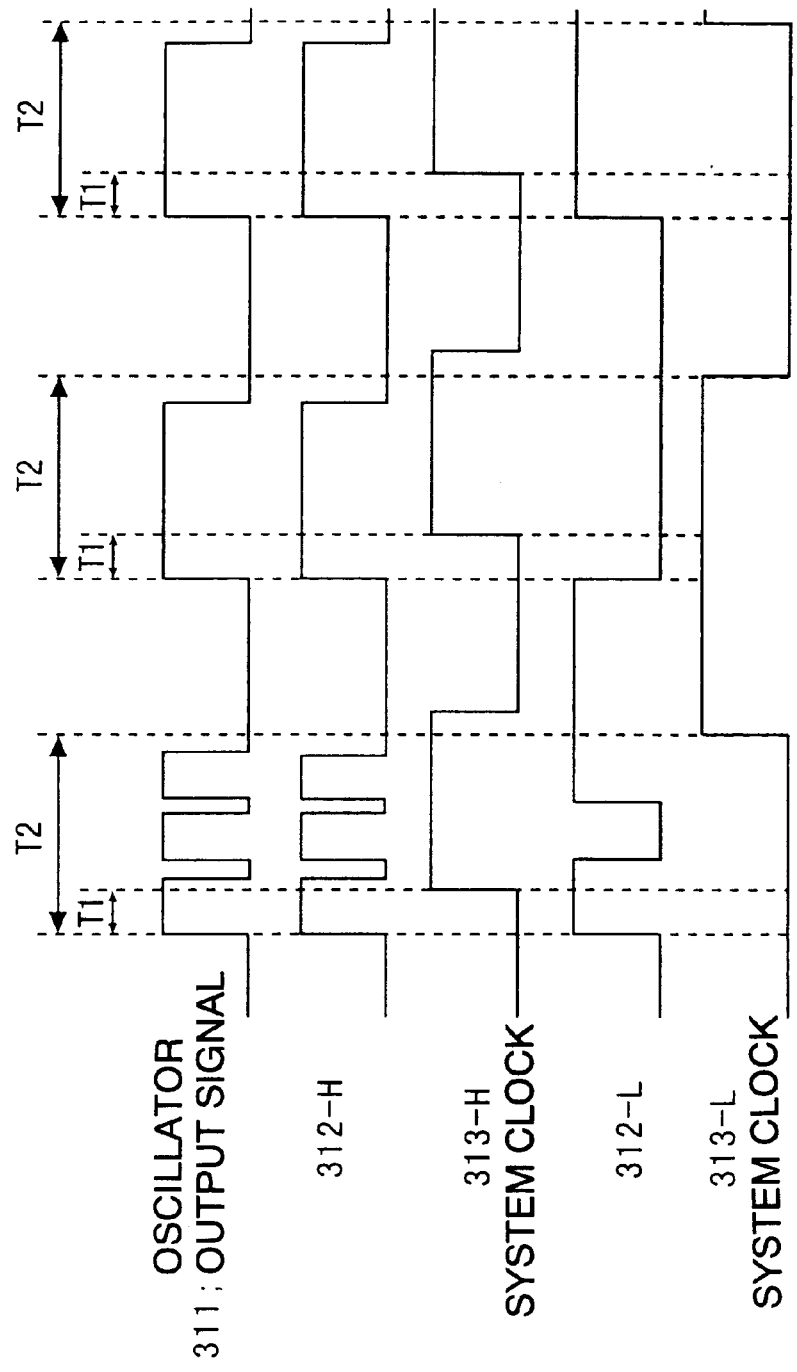
FIG. 3 is a signal waveform diagram useful in describing the operation of the pulse generating circuit according to the first embodiment.

FIG. 3 is a signal waveform diagram illustrating an example of a case in which the output signal of the oscillator 101 contains noise. A case will be described in which the output signal of the oscillator 101 contains noise of the kind shown at 311 in FIG. 3. This noisy output 311 of the oscillator is passed through the frequency divider circuit 103 of FIG. 1 to obtain the signal 312-H or 312-L.

When the operating power supply voltage is high, noise having pulses of duration shorter than the delay time T1 is eliminated. As a result, a signal from which noise has been eliminated is obtained, as indicated by signal 313-H. When the operating power supply voltage is low, noise having pulses of duration shorter than the delay time T2 is eliminated. As a result, a signal from which noise has been eliminated is obtained, as indicated by signal 313-L.

Second Embodiment

A second embodiment of the present invention will now be described with reference to the drawings.

Figure 4:
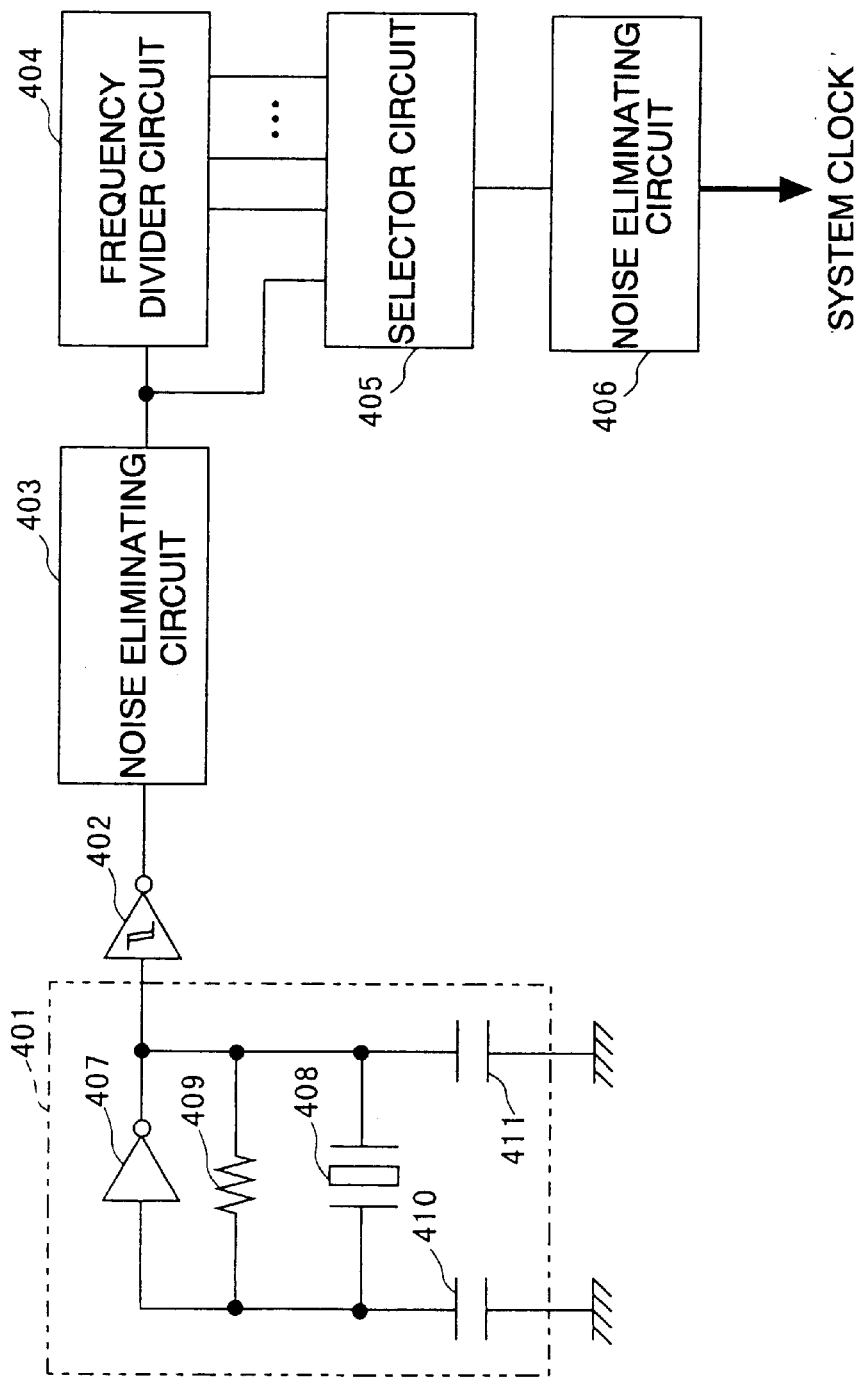
FIG. 4 is a diagram showing the construction of a pulse generating circuit according to a second embodiment of the present invention.
Figure 5:
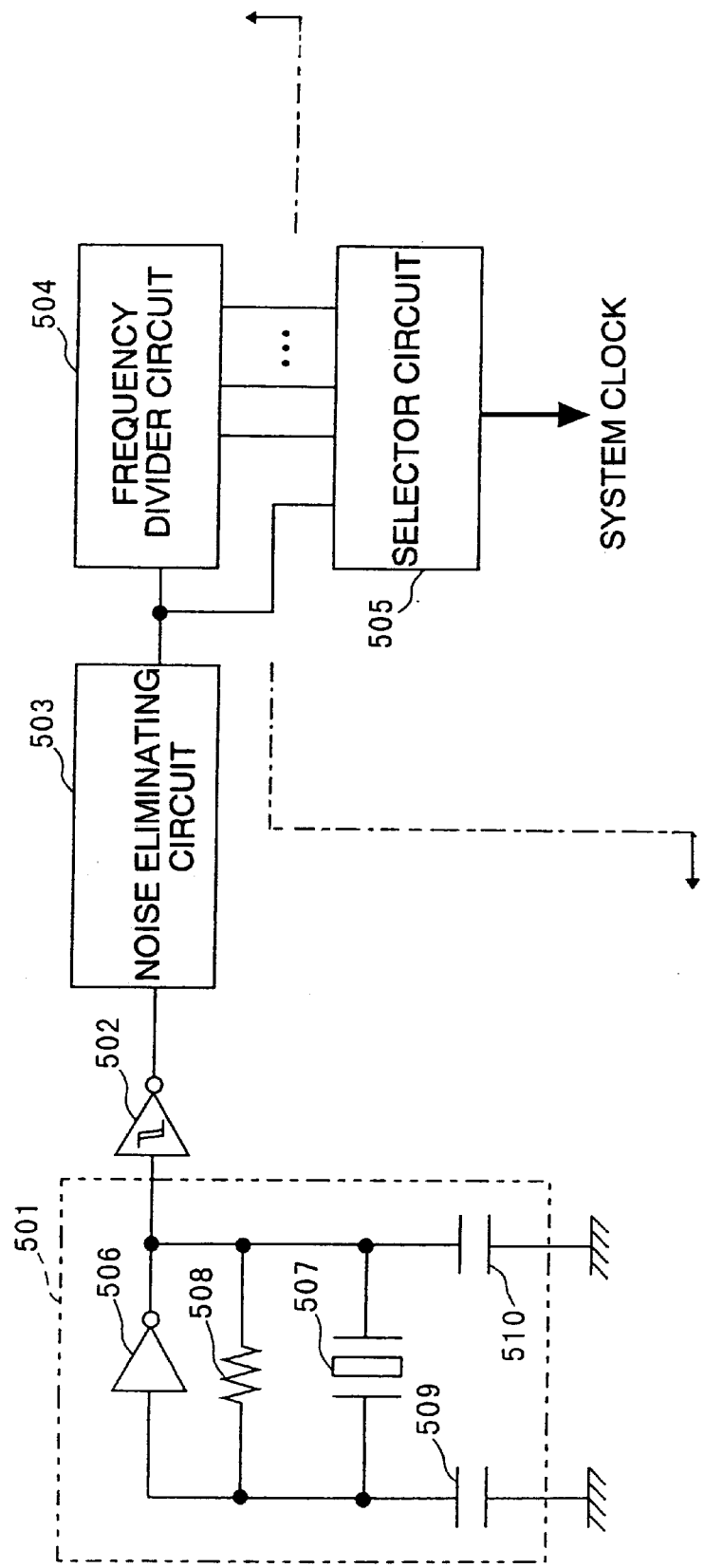
FIG. 5 is a diagram in part showing the construction of a pulse generating circuit according to the prior art.

FIG. 4 is a diagram showing the construction of a pulse generating circuit according to the second embodiment of the present invention.

As shown in FIG. 4, the output of an oscillator 401 is input to a first noise eliminating circuit 403 through a Schmitt trigger circuit 402. The first noise eliminating circuit 403 eliminates noise pulses of very short duration that would cause a frequency divider circuit 404, which is the next stage, to malfunction.

The signal from which the noise pulses of short duration have been eliminated by the first noise eliminating circuit 403 is subjected to frequency division by the frequency divider circuit 404. Any frequency-divided signal selected by a selector circuit 405 is passed through a second noise eliminating circuit 406, whereby noise is eliminated. The resulting signal from which noise has been eliminated serves as the system clock of a microcomputer. The construction shown in FIG. 6 is an example of the construction of the first and second noise eliminating circuits 403, 406.

Though the scale of the circuitry according to this embodiment is larger than that of the first embodiment, an advantage gained is greater stability.

Thus, in accordance with the present invention, a noise eliminating circuit is provided on the output side of a selector circuit that selects a frequency-divided signal from a frequency divider circuit, the latter frequency-dividing the output signal of an oscillator. As a result, it is possible to avoid limitations imposed on the noise eliminating circuit by its dependence upon operating power supply voltage. This has the effect of eliminating noise over a wide range of operating power supply voltages.

As many apparently widely different embodiments of the present invention can be made without departing from the spirit and scope thereof, it is to be understood that the invention is not limited to the specific embodiments thereof except as defined in the appended claims.

What is claimed is:

1. A circuit for generating clock signal pulses for a microcomputer comprising:

a frequency divider circuit frequency-dividing a clock pulse signal obtained by shaping the waveform of an output signal from an oscillator, a selector circuit selecting an output of said frequency divider circuit or an input to said frequency divider circuit, and a noise eliminating circuit connected to the output side of said selector circuit.

2. A pulse generating circuit comprising:

a frequency divider circuit frequency-dividing a clock pulse signal obtained by shaping the waveform of an output signal from an oscillator;

a selector circuit selecting one or a plurality of frequency-divided outputs of said frequency divider circuit or an input to said frequency divider circuit; and a first noise eliminating circuit, to which an output signal from said selector circuit is input, said first noise eliminating circuit eliminating noise from this signal and outputting a system clock signal which controls operation of a digital circuit.

3. The circuit according to claim 2, further comprising a second noise eliminating circuit, which is provided in front of said frequency divider circuit, said second noise eliminating circuit eliminating noise from the clock pulse signal whose waveform has been shaped.

4. A microcomputer having a circuit generating clock signal pulses, said circuit comprising:

a frequency divider circuit frequency-dividing a clock pulse signal obtained by shaping the waveform of an output signal from an oscillator, a selector circuit selecting an output of said frequency divider circuit or an input to said frequency divider circuit, and a noise eliminating circuit connected to the output side of said selector circuit.

5. A microcomputer having a pulse generating circuit, said pulse generating circuit comprising:

a frequency divider circuit frequency-dividing a clock pulse signal obtained by shaping the waveform of an output signal from an oscillator;

a selector circuit selecting one or a plurality of frequency-divided outputs of said frequency divider circuit or an input to said frequency divider circuit; and a first noise eliminating circuit, to which an output signal from said selector circuit is input, said first noise eliminating circuit eliminating noise from this signal and outputting a system clock signal which controls operation of a digital circuit of the microcomputer.

6. The microcomputer according to claim 5, wherein said pulse generating circuit further comprising a second noise eliminating circuit, which is provided in front of said frequency divider circuit, said second noise eliminating circuit eliminating noise from the clock pulse signal whose waveform has been shaped.

* * * * *